(12) United States Patent
Kang et al.

(10) Patent No.: US 6,542,398 B2
(45) Date of Patent: *Apr. 1, 2003

(54) MAGNETIC RANDOM ACCESS MEMORY

(75) Inventors: Chang Yong Kang, Suwon-shi (KR); Chang-Shuk Kim, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/033,320

(22) Filed: Dec. 27, 2001

(65) Prior Publication Data

US 2002/0097599 A1 Jul. 25, 2002

(30) Foreign Application Priority Data

Dec. 28, 2000 (KR) ........................................ 2000-83820

(51) Int. Cl.$^7$ ................................................ G11C 17/02
(52) U.S. Cl. .......................... 365/97; 365/171; 365/173
(58) Field of Search ........................... 365/97, 171, 173

(56) References Cited

U.S. PATENT DOCUMENTS

| | | | | |
|---|---|---|---|---|
| 6,272,036 | B1 | * 8/2001 | You et al. | ...................... 365/97 |
| 2002/0006058 | A1 | * 1/2002 | Nakajima et al. | ............ 365/171 |
| 2002/0084500 | A1 | * 7/2002 | Kang et al. | .................. 257/421 |

* cited by examiner

*Primary Examiner*—Huan Hoang
(74) *Attorney, Agent, or Firm*—Marshall, Gerstein & Borun

(57) ABSTRACT

A magnetic random access memory (MRAM) is disclosed. In order to achieve high integration, the MRAM includes a word line formed in an active region of a semiconductor substrate, and used as a read line and a write line; a ground line and a lower read layer positioned on opposite sides of the active region of the semiconductor substrate; a seed layer contacting the lower read layer, and being overlapped with the upper portion of the word line; an MTJ cell contacting the upper portion of the seed layer at the upper portion of the word line; and a bit line contacting the MTJ cell, and crossing the word line in a vertical direction.

7 Claims, 2 Drawing Sheets

MAGNETIC RANDOM ACCESS MEMORY

FIELD OF THE INVENTION

The present invention relates to a magnetic random access memory (abbreviated as 'MRAM'), and in particular to an improved MRAM having a higher speed than an SRAM, integration density as high as a DRAM, and a property of a nonvolatile memory such as a flash memory.

DESCRIPTION OF THE BACKGROUND ART

Most of the semiconductor memory manufacturing companies have developed the MRAM using a ferromagnetic material as one of the next generation memory devices.

The MRAM is a memory device for reading and writing information. It has multi-layer ferromagnetic thin films, and operates by sensing current variations according to a magnetization direction of the respective thin film. The MRAM is high speed, has low power consumption and allows high integration density due to the special properties of the magnetic thin film. The MRAM also performs a nonvolatile memory operation similar to a flash memory.

The MRAM is a memory device which uses a giant magneto resistive (abbreviated as 'GMR') phenomenon or a spin-polarized magneto-transmission (SPMT) generated when the spin influences electron transmission. The MRAM using the GMR utilizes the phenomenon that resistance is remarkably varied when spin directions are different in two magnetic layers having a non-magnetic layer therebetween to implement a GMR magnetic memory device. The MRAM using the SPMT utilizes the phenomenon that larger current transmission is generated when spin directions are identical in two magnetic layers having an insulating layer therebetween to implement a magnetic permeable junction memory device.

However, the MRAM research is still in its early stage, and mostly concentrated on the formation of multi-layer magnetic thin films. Less of the research focuses on a unit cell structure and a peripheral sensing circuit.

FIG. 1 is a cross-sectional diagram illustrating a conventional MRAM.

Referring to FIG. 1, a gate electrode 33, namely, a first word line is formed on a semiconductor substrate 31. Source/drain junction regions 35a and 35b are formed on the semiconductor substrate 31 at both sides of the first word line 33. A ground line 37a and a first conductive layer 37b are formed to contact the source/drain junction regions 35a and 35b. Here, the ground line 37a is formed in a patterning process of the first conductive layer 37b.

Thereafter, a first interlayer insulating film 39 is formed to planarize the whole surface of the resultant structure, and a first contact plug 41 is formed to contact the first conductive layer 41 through the first interlayer insulating film 39.

A second conductive layer which is a lower read layer 43 contacting the first contact plug 41 is then patterned.

A second interlayer insulating film 45 is formed to planarize the whole surface of the resultant structure, and a second word line, which is a write line 47, is formed on the second interlayer insulating film 45.

A third interlayer insulating film 48 is formed to planarize the upper portion of the second word line which is the write line 47.

A second contact plug 49 is formed to contact the second conductive layer 43.

A seed layer 51 is formed to contact the second contact plug 49. Here, the seed layer 51 is formed to overlap between the upper portion of the second contact plug 49 and the upper portion of the write line 47.

Thereafter, a semi-ferromagnetic layer (not shown), a pinned ferromagnetic layer 55, a tunnel junction layer 57 and a free ferromagnetic layer 59 are stacked on the seed layer 51, thereby forming a magnetic tunnel junction (MTJ) cell 100 which has a pattern size as large as the write line 47 and which overlaps the write line 47 as shown in FIG. 1.

At this time, the semi-ferromagnetic layer prevents the magnetization direction of the pinned layer from being changed, and the magnetization direction of the tunnel junction layer 57 is fixed to one direction. The magnetization direction of the free ferromagnetic layer 59 can be changed by an external magnetic field, and information of '0' or '1' can be stored according to the magnetization direction of the free ferromagnetic layer 59.

A fourth interlayer insulating film 60 is formed over the resultant structure, and planarized to expose the free ferromagnetic layer 59. An upper read layer, namely a bit line 61 is formed to contact the free ferromagnetic layer 59.

Still referring to FIG. 1, the operation of the MRAM will now be described. The unit cell of the MRAM includes one field effect transistor having the first word line (which is a read line) used to read information, the MTJ cell 100, the second word line 47 (which is a write line) determining the magnetization direction of the MTJ cell 100 by forming an external magnetic field by applying current, and the bit line 61 which is an upper read layer determining the magnetization direction of the free layer by applying current to the MTJ cell 100 in a vertical direction.

Here, during the operation of reading the information from the MTJ cell, a voltage is applied to the first word line 33 as the read line, thereby turning the field effect transistor on. By sensing a magnitude of current applied to the bit line 61, the magnetization direction of the free ferromagnetic layer 59 in the MTJ cell is detected.

During the operation of storing the information in the MTJ cell, while maintaining the field effect transistor in the off state, the magnetization direction in the free ferromagnetic layer 59 is controlled by a magnetic field generated from applying current to the second word line 47 (which is the write line) and the bit line 61. At this time, when current is applied to the bit line 61 and the write line 47 at the same time, the generated magnetic field is strongest at a vertical intersecting point of the two metal lines, and, thus, one cell can be selected from a plurality of cells.

The operation of the MTJ cell in the MRAM will now be described. When the current flows in the MTJ cell in a vertical direction, a tunneling current flows through an interlayer insulating film. When the tunnel junction layer and the free ferromagnetic layer have the same magnetization direction, the tunneling current increases. When the tunnel junction layer and the free ferromagnetic layer have different magnetization directions, the tunneling current decreases due to a tunneling magneto resistance (TMR) effect. A decrease in the magnitude of the current due to the TMR effect is sensed, and thus the magnetization direction of the free ferromagnetic layer is sensed, thereby detecting the information stored in the cell.

As described above, the conventional MRAM has disadvantages in that the whole fabrication process is complicated. Due to a number of fabrication steps and a stacked structure, productivity is reduced due to an increased cell area, and high integration of a semiconductor device is hardly achieved.

SUMMARY OF THE INVENTION

In accordance with an aspect of the invention, there is provided an MRAM including: a semiconductor substrate having an active region, the active region having a first side and a second side, a word line formed in the active region of the semiconductor substrate, the word line serving as a read line and a write line; a ground line and a lower read layer respectively formed at the first side and the second side of the active region of the semiconductor substrate; a seed layer formed to be in electrical communication with the lower read layer, the seed layer overlapping an upper portion of the word line; an MTJ cell contacting the upper portion of the seed layer at the upper portion of the word line; and a bit line contacting the MTJ cell, the bit line being perpendicular to the word line.

DETAILED DESCRIPTION OF THE PREFERRED EMBODIMENTS

Figure 1:
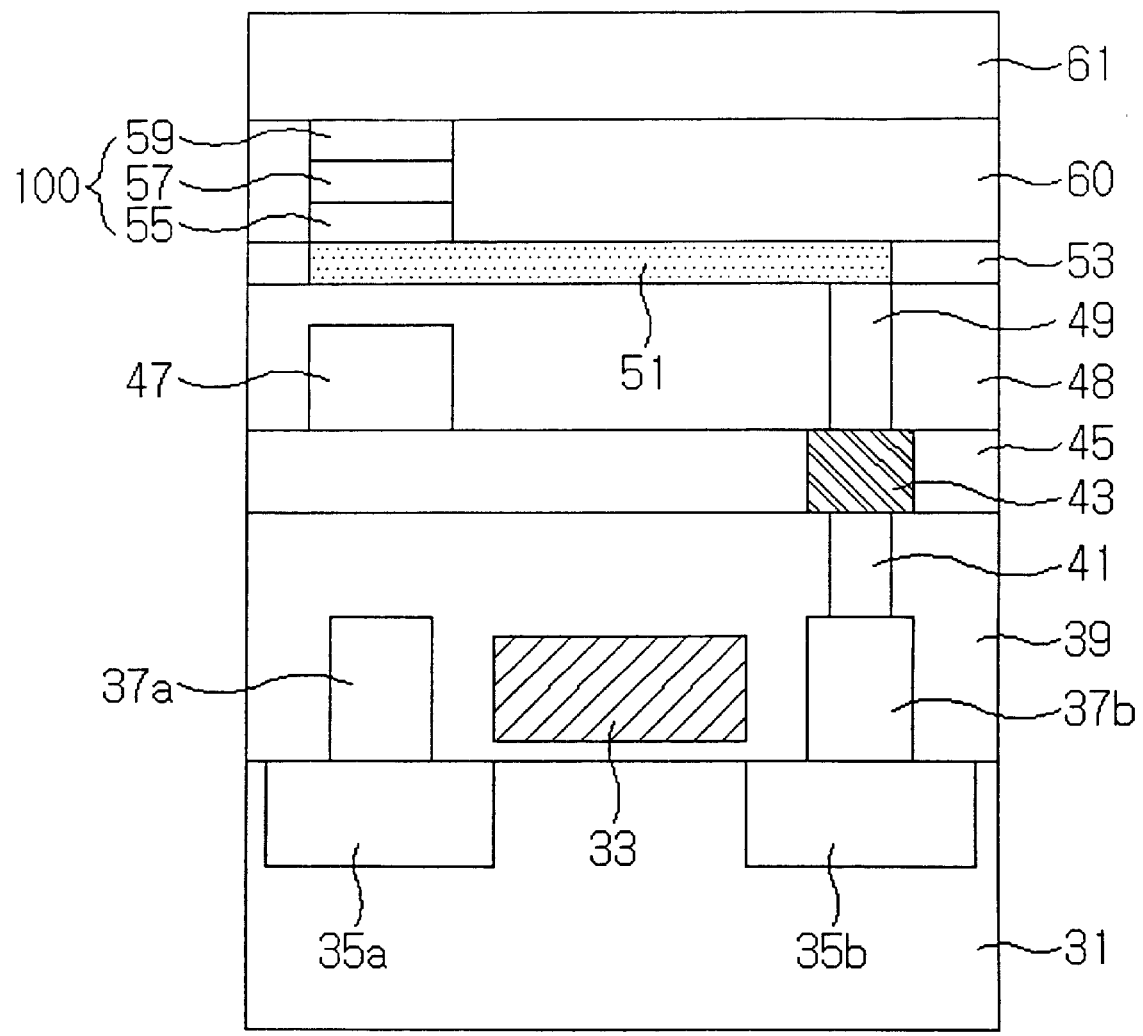
FIG. 1 is a cross-sectional diagram illustrating a conventional MRAM.
Figure 2:
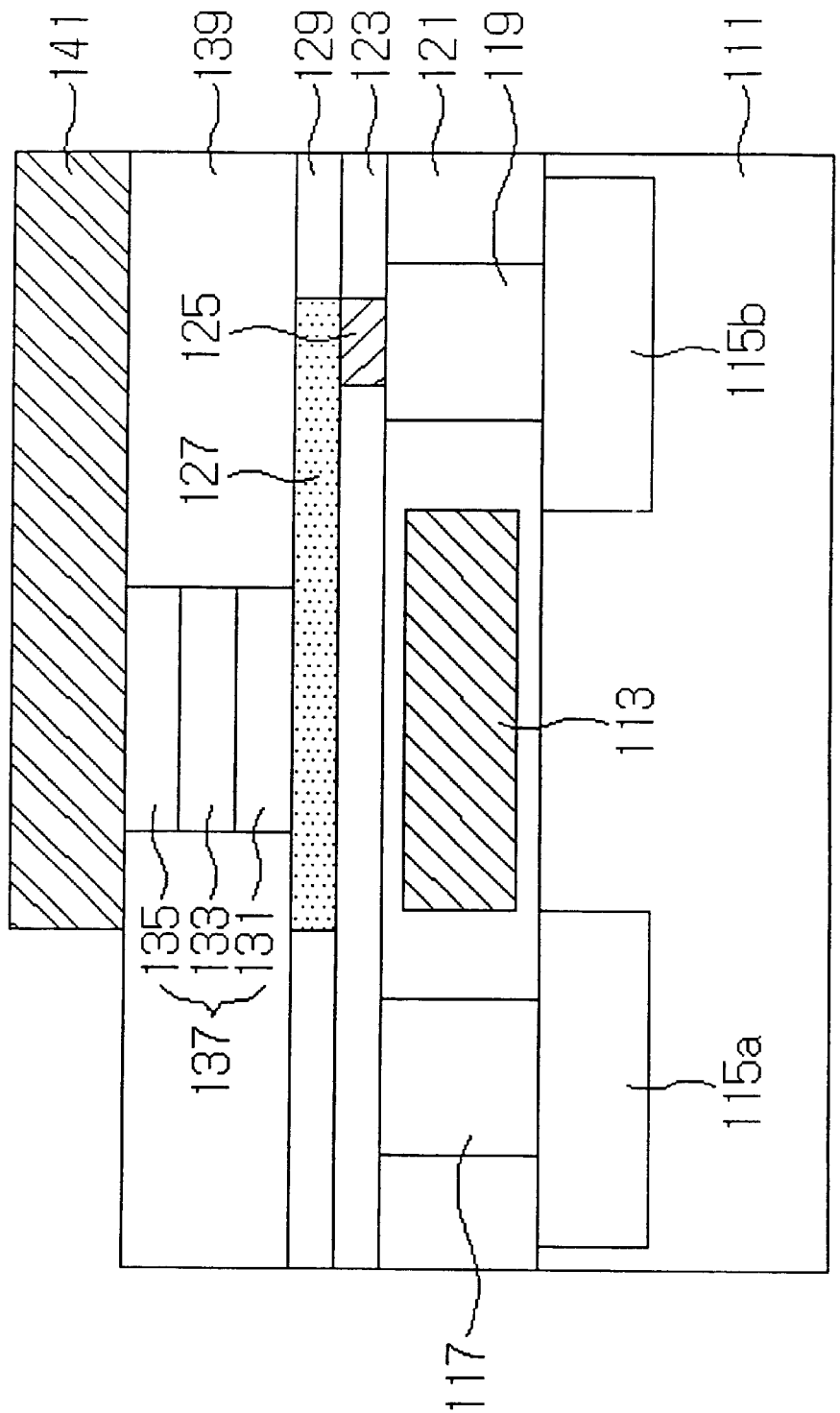
FIG. 2 is a cross-sectional diagram illustrating an exemplary MRAM constructed in accordance with the teachings of the present invention.

An exemplary magnetic random access memory (MRAM) constructed in accordance with the teachings of the present invention will now be described in detail with reference to the accompanying drawings. FIG. 2 is a cross-sectional diagram illustrating the exemplary MRAM. The process for forming the MRAM will now be explained.

As illustrated in FIG. 2, an element isolating film (not shown) defining an active region is formed on a semiconductor substrate 111. A gate electrode 113 having a gate insulating film is formed in the active region of the semiconductor substrate 111, an insulating film spacer (not shown) is formed at the side walls of the gate electrode 113, and an impurity is implanted into the active region of the semiconductor substrate 111, thereby forming source/drain junction regions 115a and 115b. Thus, formation of a transistor is finished.

The gate electrode 113 has a stacked structure of a polysilicon film/tungsten film, a polysilicon film/tungsten film/polysilicon film, or a copper film/polysilicon film/copper film to improve conductivity. Therefore, the upper portion of the gate electrode 113 is oxidized to form a thin insulating film.

Thereafter, a first interlayer insulating film 121 is formed to planarize the whole surface of the resultant structure. Here, the first interlayer insulating film 121 includes a ground line 117 contacting the source junction region 115a, and a lower read layer 119 contacting the drain junction region 115b.

Influences of a magnetic field are increased as the distance between the MTJ cell of the MRAM and the gate electrode 113 used as the write line is reduced. Accordingly, a thickness of an interlayer insulating film formed in a succeeding process is reduced.

The first interlayer insulating film 121 is planarized to expose the surfaces of the lower read layer 119 and the first word line 113 which is the gate electrode.

A second interlayer insulating film 123 is formed on the first interlayer insulating film 121, and a contact plug 125 is formed to contact the lower read layer 119 through the second interlayer insulating film 123.

A seed layer 127 is formed to contact the lower read layer 119 through the contact plug 125. Here, the seed layer 127 extends to the upper portion of the first word line 113 to sufficiently overlap the first word line 113.

A third interlayer insulating film 129 is formed in a flat type to expose the seed layer 127.

An MTJ cell 137 is formed on the seed layer 127, preferably over the first word line 113.

Here, the MTJ cell 137 is formed by forming a stacked structure of a semi-ferromagnetic layer (not shown) contacting the seed layer 127, a pinned ferromagnetic layer 131, a tunnel junction layer 133 and a free ferromagnetic layer 135, and by patterning the stacked structure according to a photolithography process using an MTJ cell mask.

Thereafter, a planarized fourth interlayer insulating film 139 is formed to expose the MTJ cell 137, and a bit line contacting the free ferromagnetic layer 135 of the MTJ cell 137, namely an upper read layer 141 is formed, thereby finishing formation of the MRAM cell.

The data storing operation of the example MRAM of FIG. 2 will now be described.

First, a free spin structure of the MTJ cell 137 is varied by using a magnetic field generated by the current applied to the gate electrode which is the first word line 113. Here, a ground potential of the ground line 117 is raised by applying voltage or current, to prevent the current of the MTJ cell 137 from flowing to the ground line through the transistor. It is possible to simultaneously apply a Vss ground voltage to the ground line 117 and a Vbs substrate voltage to the semiconductor substrate 111. In addition, the substrate voltage can be applied to the ground line 117 and the semiconductor substrate 111.

Here, the ground voltage and the substrate voltage are identical to or greater than the voltage applied to the ground line 117 through the transistor during the write operation.

When the ground potential of the ground line 117 is not raised, the current applied through the bit line 141 during the write operation flows to the semiconductor substrate 111 through the MTJ cell 137. The first word line 113 is in a high state, and thus the current flows to the ground line 117 through the transistor. As a result, the write operation cannot be smoothly performed.

As discussed earlier, the first word line 113 serves as the write line, and, thus, a formation process of a second word line is omitted. Accordingly, high integration of the device is achieved, and process reliability is increased due to simplification of the whole process.

From the foregoing, persons of ordinary skill in the art will appreciate that an MRAM has been provided which has a simpler structure and higher integration then prior MRAMs. The illustrated MRAM achieves these advantages by using the first word line as both the read line and the write line. Persons of ordinary skill in the art will further appreciate that the entire fabrication process of the illustrated MRAM is simplified relative to prior art MPAMs, thereby improving reliability and productivity of the device.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A magnetic random access memory (MRAM) comprising:
- a semiconductor substrate having an active region, the active region having a first side and a second side;
- a word line formed in the active region of the semiconductor substrate, the word line serving as a read line and a write line;
- a ground line and a lower read layer respectively formed at the first side and the second side of the active region of the semiconductor substrate;
- a seed layer formed to be in electrical communication with the lower read layer, the seed layer overlapping an upper portion of the word line;
- an MTJ cell contacting the upper portion of the seed layer at the upper portion of the word line; and
- a bit line contacting the MTJ cell, the bit line being perpendicular to the word line.

2. An MRAM according to claim 1, wherein the word line is a gate electrode, and the gate electrode has a stacked structure selected from the group comprising: a stacked structure of a polysilicon film/tungsten film, a stacked structure of a polysilicon film/tungsten film/polysilicon film, and a stacked structure of a copper film/polysilicon film/copper film.

3. An MRAM according to claim 1, further comprising an insulating film between the word line and adjacent conductive layers.

4. An MRAM according to claim 1, wherein the MTJ cell has a stacked structure including a pinned ferromagnetic layer, a tunnel junction layer and a free ferromagnetic layer.

5. An MRAM according to claim 1, wherein a ground voltage is applied to the ground line during a write operation.

6. An MRAM according to claim 1, wherein a ground voltage is applied to the ground line, and a substrate voltage is applied to the semiconductor substrate during a write operation.

7. An MRAM according to claim 1, wherein a substrate voltage is applied to the ground line and the semiconductor substrate.

* * * * *